March 26, 1974 V. DANCHENKO 3,799,813

RADIATION HARDENING OF MOS DEVICES BY BORON

Filed Dec. 9, 1971

INVENTOR
VITALY DANCHENKO

BY Carl Levy

ATTORNEYS

United States Patent Office 3,799,813

Patented Mar. 26, 1974

3,799,813

RADIATION HARDENING OF MOS DEVICES BY BORON

Vitaly Danchenko, Silver Spring, Md., assignor to the United States of America as represented by the Administrator of the National Aeronautics and Space Administration Filed Dec. 9, 1971, Ser. No. 206,266
Int. Cl. H01l 7/54
U.S. Cl. 148—1.5 5 Claims

ABSTRACT OF THE DISCLOSURE

A novel technique is disclosed for radiation hardening of MOS devices and specifically for stabilizing the gate threshold potential at room temperature of a radiation subjected MOS field-effect device of the type having a semiconductor substrate, an insulating layer of oxide on the substrate, and a gate electrode disposed on the insulating layer. In the preferred embodiment, the novel inventive technique contemplates the introduction of boron into the insulating oxide, the boron being introduced within a layer of the oxide of about 100 A–300 A thickness immediately adjacent the semiconductor-insulator interface. The concentration of boron in the oxide layer is preferably maintained on the order of $10^{18}$ atoms/cm.$^3$. The novel technique serves to reduce and substantially annihilate radiation induced positive gate charge accumulations, which accumulations, if not eliminated, would cause shifting of the gate threshold potential of a radiation subjected MOS device, and thus render the device unstable and/or inoperative.

ORIGIN OF THE INVENTION

The invention described herein was made by an employee of the United States Government and may be manufactured and used by or for the government for governmental purposes without the payment of any royalties thereon or therefor.

BACKGROUND OF THE INVENTION

This invention generally relates to MOS devices and particularly concerns a technique whereby the gate threshold potential, generally at room temperature, of a radiation subjected MOS field-effect device is stabilized.

A MOS (metal-oxide-semiconductor) device, as is known, includes a semiconductor substrate, an insulating layer of oxide on the substrate, and a gate electrode disposed on the insulating layer. With a MOS field-effect transistor, for example, additional source and drain electrodes are disposed to either side of the gate electrode and a lateral current may be caused to flow between the source and drain electrodes through application of proper bias potential to the gate electrode. Specifically, and in the so-called "enhancement" mode, application of a biased potential to the gate produces a conducting layer beneath the metal oxide allowing lateral current flow between the source and drain electrodes. In a second mode of operation such as the so-called "depletion" mode, application of a bias potential to the gate electrodes produces an insulating region between the source and drain electrodes which serves to decrease current conduction.

With the usual MOS devices, several volts, such as three or four volts of negative potential is necessary to be applied to the gate in the p-channel enhancement mode of the MOS device whereas, with a n-channel device, a few volts of positive potential applied to the gate is needed. By way of definition, the gate voltage at which approximately ten microamperes of drain current flows is commonly defined as the gate threshold potential of any particular MOS device.

Such MOS devices, when subjected or exposed to ionizing radiation such as would occur in a space environment, suffer radiation damage in the form of charge trapped in the oxide and/or at the oxide-semiconductor interface and undergo various changes in the electrical characteristics thereof. Such damage is not always permanent, but can oftentimes be "healed" or reduced through a time and/or temperature annealing process.

One particular dominant and harmful effect on MOS devices due to their exposure to radiation has been a shift in the above-described gate threshold potential, these shifts commonly occurring toward the more negative gate voltages. As a result of these shifts in the gate threshold potentials, and at sufficient enough doses of ionizing radiation, the devices and the circuits in which they are placed become unstable and in some instances are actually rendered inoperative.

In order to safeguard the operation of electronic circuits which contain MOS devices such as on board a spacecraft, for example, the MOS devices are normally shielded against the space ionizing radiation, the shielding normally comprising a heavy material designed to absorb most of the ionizing radiation from space and also radiation emanating from any other sources that might be present on board the spacecraft itself, such as a nuclear power source or the like. As can be appreciated, however, the utilization of such shielding materials greatly increases the weight of a spacecraft and, as such, may pose severe disadvantages particularly for deep space missions where weight limitations are severe. Furthermore, even if the radiation shielding is sufficient, the danger always exists that the shielding itself might be improperly designed or that an unexpected source of radiation may appear, or that the probability of malfuction of the various circuits may increase due to even small changes in the operating characteristics of the MOS devices.

SUMMARY OF THE INVENTION

It is a primary object of the instant invention to provide a novel technique whereby MOS devices of the type described can be "hardened" against radiation without requiring the utilization of external shielding.

A more specific object of the instant invention concerns the provision of a radiation hardening technique for MOS devices whereby the gate threshold potential, at room temperature, of a radiation subjected MOS field-effect device is stabilized against radiation-induced shifting thereof.

These important objects, as well as others which will become apparent as the description proceeds, are implemented by the instant invention which broadly can be described as comprising a novel technique for radiation hardening of MOS devices and specifically for stabilizing the gate threshold potential at room temperature of a radiation subjected MOS field-effect device of the type having a semiconductor substrate, and a gate electrode disposed on the insulating layer.

In the preferred embodiment, the novel inventive technique contemplates the introduction of boron or other elements having so-called "acceptor" properties into the insulating oxide, the boron being introduced with a layer of the oxide of about 100 A–300 A. thickness immediately adjacent the semiconductor-insulator interface. The concentration of boron in the oxide layer is preferably maintained on the order of $10^{18}$ atoms/cm.$^3$. The novel technique serves to reduce and substantially annihilate radiation induced positive gate charge accumulations, which accumulations, if not eliminated, would cause shifting of the gate threshold potential of a radiation subjected MOS device, and thus render the device as well as the associated circuitry unstable and/or inoperative.

BRIEF DESCRIPTION OF THE DRAWINGS

The invention itself will be better understood and further features thereof will be recognized from the following detailed description of a preferred inventive embodiment, such description referring to the appended sheet of drawings, wherein.

DETAILED DESCRIPTION OF A PREERRED INVENTIVE EMBODIMENT

Figure 1:
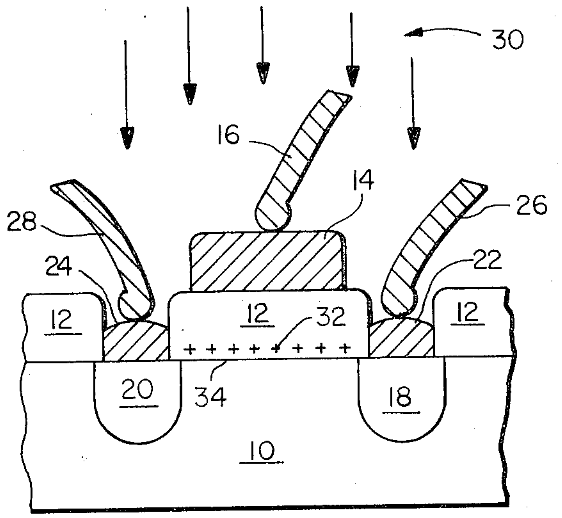
FIG. 1 is a side elevational section, partially broken away for illustrative clarity, of a typical MOS field-effect device subjected to a source of external ionizing radiation.

Referring now to FIG. 1 of the appended drawings, a typical MOS field-effect device is illustrated such as would be utilized in large scale integrated logic and memory circuits, for example. Such device typically comprises a substrate 10 of semiconductor material such as silicon, an insulating layer 12 of oxide such as silicon oxide ($SiO_2$) disposed on the semiconductor substrate 10 and a metallic gate electrode 14 disposed on the insulating layer 12, to which gate electrode 14 a connecting wire 16 may be attached. Source and drain regions 18 and 20, respectively, are provided in the semiconductor substrate 10 and have associated therewith metallic electrodes 22 and 24, respectively, along with connecting wires 26 and 28.

As briefly explained at the outset, such MOS field-effect devices are composed of either n-channel or p-channel types or, in a complementary version, of both n-channel and p-channel types. With a p-channel MOS device, the semiconductor substrate 10 would be fabricated of n-type silicon, for example, and the source and drain regions 18 and 20, respectively, would incorporate p-type silicon achieved through suitable doping of the underlying substrate. With an n-channel MOS field-effect device, the underlying semiconductor substrate 10 would be composed of p-type silicon and the source and drain regions 18 and 20, respectively, would comprise n-type silicon, for example. As mentioned, current flow between the source and drain regions 18 and 20 of the MOS device is controlled by a voltage applied to the gate electrode 14 and thus to the insulating oxide layer 12. Specifically, to turn on a p-channel enhancement mode MOS device a few volts, such as 3 or 4 volts of negative potential is necessary and to turn on a n-channel MOS device, a few volts of positive potential applied to the gate is needed. The threshold potential of a given MOS field-effect device is defined herein as being the gate voltage at which approximately 10 microamperes of drain current is caused to flow.

When an MOS field-effect device of the type described with respect to FIG. 1 is subjected or exposed to an external source of ionizing radiation such as generally depicted by reference numeral 30, ionization of the gate insulating oxide 12 occurs due to the energetic particles of the external radiation 30 such as is present in the space environment. A subsequent accumulation of positive charges such as indicated by reference numeral 32 will build up in the oxide layer 12 generally adjacent the semiconductor-insulator interface 34. The specific region of the oxide layer 12 in which most of the radiation-induced positive charges accumulate has been found to be within about 100 A. of the semiconductor-insulator interface 34. This positive radiation-induced charge accumulation in the gate oxide 12 comprises the cause of the mentioned shifts in the threshold potentials of MOS devices subjected or exposed to external radiation.

Figure 2:
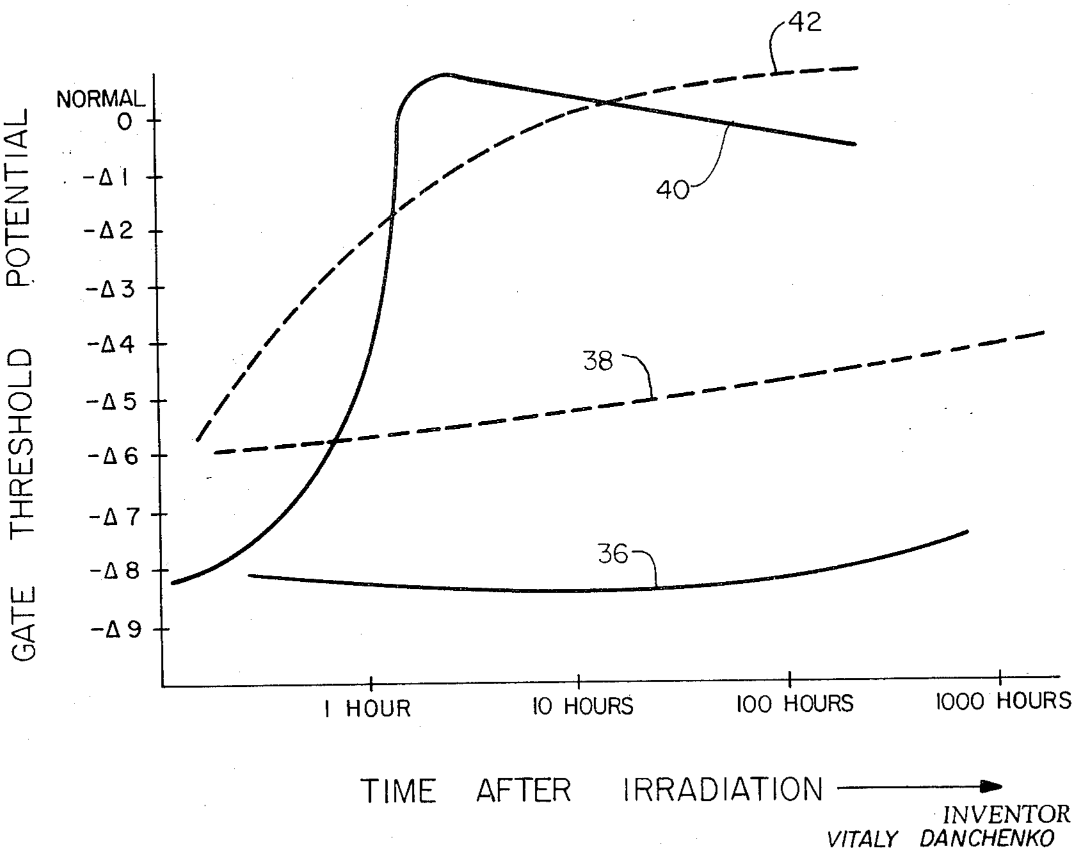
FIG. 2 is a graphical illustration of the shifting of gate threshold potential of an MOS device subjected to radiation, and the time for self-recovery of such radiation damage at room temperature.

This radiation damage in the form of shifts in gate threshold potential is, to some extent, self-healing at room temperature and attention is herein directed to FIG. 2 of the appended drawings. In FIG. 2, the abscissa of the curve represents deviations in gate threshold potential from a normal or "zero" value of an MOS device when subjected to external radiation, and the ordinate of the curve represents the self-recovery or healing time in hours of the gate threshold potential, i.e., the time necessary, at room temperature, for the radiation damage to the MOS device to be cured at room temperature.

For a typical p-channel MOS device, curve 36 represents the rate of recovery, whereas for a typical n-channel MOS device, dotted-line curve 38 represents the recovery rate. These relatively slow healing times as can be appreciated from a review of the graphs renders the typical MOS device unsuitable for operation in an external radiation environment unless physical shielding is utilized.

Applicant has discovered, however, that the introduction of boron or other elements have so-called "acceptor" properties into the insulating oxide layer 12 at the semiconductor-insulator interface 34 of the device depicted in FIG. 1, for example, reduces the radiation induced positive gate charge accumulations 32. Specifically, the novel technique of the instant invention contemplates the introduction of boron into a thin layer of about 100 A.–300 A. of the gate oxide 12 immediately at the semiconductor-insulator interface 34 so as to effect the annihilation or leak off of the radiation-induced accumulated positive charges. In the preferred inventive embodiment, the concentration of boron in the oxide layer is maintained on the order of $10^{18}$ atoms/cm.$^3$.

By so introducing boron in the above-described manner, a rapid self-recovery of the threshold potential in radiation exposed or subjected n- and p-channel MOS devices at room temperature will result and, in this picted in FIG. 2 is on the order of $10^{18}$ atoms/cm.$^3$. The appended drawings. Curve 40 is illustrative of the self-recovery time, at room temperature, of the gate threshold potential of a p-type MOS field-effect device, whereas dotted-line curve 42 represents the self-recovery time of an n-channel MOS device at room temperature, such devices being treated in accordance with the radiation hardening technique of the instant invention. As can be appreciated from this illustrative graphical data, a complete recovery after irradiation with an external radiation dose of approximately $10^{13}$ electrons/cm.$^2$ at 1.5 me./v. of the threshold potentials of n-channel MOS devices has been achieved in accordance with the instant invention in somewhat less than 8 hours at room temperature, and, in p-channel MOS devices treated in accordance with the technique of the instant invention, recovery has occurred in less than 3 hours after irradiation as depicted by curve 40 in FIG. 2, whereas no recovery would occur in the untreated MOS devices as depicted by curve 36 of FIG. 2. As should be appreciated, with the novel radiation hardening technique described herein, it now is possible to construct n-channel, p-channel, and complementary MOS integrated circuits which will substantially be immune to space radiation as far as the shift in the gate threshold potentials are concerned. In fact, it should be recognized that in space, radiation is of an even lower dose rate than that contemplated above even in the more highly concentrated regions of the Van Allen belts, so that the self-recovery of MOS field-effect devices treated in accordance with the instant invention would be much faster than would be the accumulation of positive charges in the oxide layer.

As explained, the preferred concentration of boron in the gate oxide layer of an MOS device which produced the rapid self-recovery of the threshold potential as depicted in FIG. 2 is on the order of $14^{18}$ atoms/cm.$^3$. The smaller the boron concentration, the slower is the recovery of the threshold potentials. For purposes of explanation, it should be understood that an estimated boron impurity concentration in the typical devices that exhibit a slow recovery at room temperature such as the n-channel sample depicted by curve 38, is only about $2\times10^{17}$ atoms/cm.$^3$.

The specific mechanisms by which the introduction of boron in the above-described fashion serves to reduce and substantially annihilate radiation-induced positive gate charge accumulations in the oxide of an MOS device is not entirely understood though it can be theorized that the positive induced charges are either diffused into the semiconductor region, or contained with traps of negative charge states such as boron atoms in silicon. In any event, the annihilation of such charges have been experimentally observed rendering the boron treated MOS device essentially self-healing and effecting spontaneous recovery of radiation damage at room temperature, which temperature is herein commonly defined as 25° C.

A number of methods or techniques typical to those known in the prior art can be utilized to introduce boron into the gate oxide of the MOS device. One method for example, comprises the usual gaseous tribromide method wherein, after boron diffusion at from 700–1200° C. into 300 A. of thermally grown oxide, the remainder of the gate oxide, up to 1100 A. thick may be built up by pyrolytic deposition. Other methods of boron introduction are diffusion of boron from a boron nitrite wafer and the ion implantation method, as is known.

It should now be apparent that the objects initially set forth at the outset of this specification have successfully been achieved.

What is claimed is:

1. A method of stabilizing the gate threshold potential of a radiation subjected MOS field-effect device of the type having a semiconductor substrate, an insulating layer of oxide on the substrate, and a gate electrode disposed on the insulating layer, said method comprising the step of introducing boron into the insulating oxide layer at the semiconductor-insulator interface so as to reduce radiation induced positive gate charge accumulations.

2. The method defined in claim 1, in which the boron is introduced within a layer of the oxide of about 100 A.–300 A. thickness immediately adjacent the semiconductor-insulator interface.

3. The method defined in claim 2, in which the concentration of boron in the oxide layer is maintained on the order of $10^{18}$ atoms/cm.$^3$.

4. The method defined in claim 2, wherein said boron is introduced into the oxide layer by diffusion.

5. The method defined in claim 2, wherein said boron is introduced into the oxide layer by ion implantation.

References Cited

UNITED STATES PATENTS

| | | | |
|---|---|---|---|
| 3,442,721 | 5/1969 | McCaldin et al. | 148—1.5 X |
| 3,448,353 | 6/1969 | Gallagher et al. | 317—235 |
| 3,733,222 | 5/1973 | Schiller | 148—1.5 |

L. DEWAYNE RUTLEDGE, Primary Examiner

J. M. DAVIS, Assistant Examiner

U.S. Cl. X.R.

148—186; 317—235